United States Patent
Yang

(10) Patent No.: US 10,319,448 B2
(45) Date of Patent: Jun. 11, 2019

(54) CIRCUITS AND METHODS OF REFERENCE-CURRENT GENERATION FOR FLASH

(71) Applicant: SHANGHAI HUAHONG GRACE SEMICONDUCTOR MANUFACTURING CORPORATION, Shanghai (CN)

(72) Inventor: Guangjun Yang, Shanghai (CN)

(73) Assignee: Shanghai Huahong Grace Semiconductor Manufacturing Corporation, Shanghai (CN)

(*) Notice: Subject to any disclaimer, the term of this patent is extended or adjusted under 35 U.S.C. 154(b) by 0 days.

(21) Appl. No.: 15/609,414

(22) Filed: May 31, 2017

(65) Prior Publication Data

US 2018/0137923 A1 May 17, 2018

(30) Foreign Application Priority Data

Nov. 15, 2016 (CN) .......................... 2016 1 1025167

(51) Int. Cl.
*G11C 16/28* (2006.01)
*G11C 16/04* (2006.01)
(Continued)

(52) U.S. Cl.
CPC .......... *G11C 16/28* (2013.01); *G11C 16/0483* (2013.01); *G11C 16/08* (2013.01); *G11C 16/16* (2013.01)

(58) Field of Classification Search
CPC .............................. G11C 16/0483; G11C 16/10
(Continued)

(56) References Cited

U.S. PATENT DOCUMENTS 5,946,238 A * 8/1999 Campardo ............. G11C 16/28
365/185.2
6,215,697 B1 * 4/2001 Lu ........................ G11C 11/5621
365/185.2
(Continued)

FOREIGN PATENT DOCUMENTS

CN 103140895 A 6/2013
CN 103426478 A 12/2013

OTHER PUBLICATIONS

First Office Action issued in corresponding Chinese Patent Application No. 201611025167.9, dated Mar. 21, 2019, 6 pages.

*Primary Examiner* — Hoai V Ho
*Assistant Examiner* — Minh Dinh
(74) *Attorney, Agent, or Firm* — MKG, LLC

(57) ABSTRACT

A reference-current generation method for flash includes first and second memory arrays separated by a word-line switching circuit. A reference-current generation circuit includes rows of reference cells, the first row parallel with the other rows of the first memory array and having the same number of columns as the other rows thereof, and the second row parallel with the other rows of the second memory array and having the same number of columns as the other rows thereof. The first reference word line of the first row is disconnected with the second reference word line of the second row. After programming, the first row enables the first memory array to create the first reference current used while performing read operation for the second memory array, and the second row enables the second memory array to create the second reference current used while performing read operation for the first memory array.

14 Claims, 2 Drawing Sheets

(51) Int. Cl.
*G11C 16/08* (2006.01)
*G11C 16/16* (2006.01)

(58) Field of Classification Search
USPC .................................................. 365/185.17
See application file for complete search history.

(56) References Cited

U.S. PATENT DOCUMENTS

| | | | |
|---|---|---|---|
| 9,659,624 B1* | 5/2017 | Hendrickson | G11C 11/1673 |
| 9,747,965 B2* | 8/2017 | Jan | G11C 11/1673 |
| 2005/0157541 A1 | 7/2005 | Iwata | |
| 2010/0277972 A1* | 11/2010 | Ueda | G11C 11/1659 365/158 |

* cited by examiner

CIRCUITS AND METHODS OF REFERENCE-CURRENT GENERATION FOR FLASH

TECHNICAL FIELD

This invention relates to the field of semiconductor integrated circuits, and particularly relates to a reference-current generation circuit for flash. This invention also relates to a method for generating reference current of flash.

BACKGROUND

A floating-gate transistor is mainly used in a flash to store information. Compared with a normal MOSFET, a floating gate is added to the gate electrode structure of the floating-gate transistor. The threshold voltage of the device is different when charge is stored in the floating gate from when the charge is not stored. Consequently, the floating-gate transistor remains in different status. For N-type devices, the threshold voltage thereof may increase after charges are written into (i.e., programmed into) the floating gate, and the channel is cut off when voltage is not applied to the control gate; the threshold voltage thereof may decrease after charges are erased from the floating gate, and the channel is turned on when voltage is not applied to the control gate.

Normally, a memory cell is composed of a floating-gate transistor. Multiple memory cells are arranged into array structures thereby forming flash arrays. Memory cells in the flash array are linked to their corresponding word lines, bit lines and source lines. When signals are added to respective word lines and bit lines in accordance with relevant address signals, the related memory cells can be selected, thereby performing Read, Erase and Program operations for the selected memory cells.

While reading memory cells, it is necessary to extract currents from respective bit lines and to judge the status of memory cells by comparing the bit line current with the reference current. For instance, when a memory cell is in an Erase status, the channel thereof is turned on, so that it is possible to extract current larger than reference current from corresponding bit line; when a memory cell is in a Program status, the channel thereof is cut off, in this way, the current extracted from corresponding bit lines will be smaller than the reference current.

Therefore, the reference current plays the role of a benchmark in the reading process of a memory cell, and it is necessary for the reference current to correctly reflect the status of the memory cell. FIG. 1 is a reference-current generation circuit for flash, which is independent from the flash array, therefore, the structure of the flash array is not shown in FIG. 1. The reference-current generation circuit 101 is composed of a number of reference cells 102 being arranged into an array of columns and rows. The reference cell 102 usually has the same structure as the memory cell and both of them are formed simultaneously by the same process. The reference-current generation circuit array 101 in FIG. 1 is composed of m rows and n columns. All the reference cells 102 of the same row are linked by the same word line. All the word lines are represented by WL0, WL1, WL2 until WLm respectively, of which "WL" stands for a word line and the number immediately after the "WL" represents the number of the respective row; all the reference cells 102 of the same column are linked by the same bit line. In order to differentiate these bit lines from the bit lines in memory cells, the bit lines in FIG. 1 are what provide references for the bit lines in memory cells, and therefore are also called reference bit lines. So all the reference bit lines in FIG. 1 are represented by RefBL0, RefBL1, RefBL2 until RefBLn respectively, of which "RefBL" stands for a reference bit line and the number immediately after the "RefBL" represents the number of the respective column. As shown in FIG. 1, reference currents are provided by the reference bit lines of the columns, and they are represented by Iref0, Iref1, Iref2 until Irefn respectively.

All the reference cells 102 in FIG. 1 adopt a status of Erase, that is to say, various reference cells 102 will not be programmed. The reference current finally provided is the average value of the currents of various reference bit lines multiplied by a corresponding proportional coefficient, which can be represented by the following formula (1):

$$Iref = \frac{x}{n+1} \times \sum_{i=0...n} Irefi; \quad (1)$$

wherein, "Iref" represents the reference current finally provided by the reference-current generation circuit 101; "n" represents the maximum of the column numbers; "i" stands for the column number with which each summation item corresponds; "Irefi" represents the current of the reference bit line for column i.

In general, a reference cell 102 is the same as a memory cell, and the reference cell 102 is in Erasure status. In other words, the reference current is obtained via the memory cell having undergone a saturated erasure. Since the reference cell 102 remains in an erased status but the memory cell in the flash array may be erased repeatedly in the course of usage, the memory cell in the flash array may vary with work processes, voltages and temperature, etc., while the reference cell 102 obviously cannot track these changes of the memory cells in the flash array. Thus, the reference cell 102 has a feature that the I_V and temperature of the reference cells are unable to track the changes of the memory cells, i.e., the characteristic of track tail bit, thus affecting the velocity and precision of the sensitive amplifier as well as the yield and performance of the flash as a whole.

SUMMARY OF THE INVENTION

The technical problem which this invention aims to resolve is to provide a reference-current generation circuit for flash which can enhance the velocity and precision of the sensitive amplifier as well as the quality and performance of the entire flash. This invention provides a reference-current generation circuit for flash for this purpose.

In order to resolve the above-mentioned technical problem, the reference-current generation circuit for flash provided by this invention includes at least two flash arrays, namely the first memory array and the second memory array, both having the same number of rows consisting of memory cells.

The reference-current generation circuit includes the first row of reference cells and the second row of reference cells. Both the said first row of reference cells and the said second row of reference cells are composed of the rows consisting of reference cells. The said first row of reference cells is parallel with the other rows of the said first flash array and has the same number of columns as the other rows thereof. The said second row of reference cells is parallel with the other rows of the said second flash array and has the same number of columns as the other rows thereof.

The word-line switching circuit is arranged between the said first flash array and the said second flash array, and is extended between the said first row of reference cells and the said second row of reference cells. Under the read operation mode of the said flash, the said word-line switching circuit causes the word lines of various rows of the said first flash array to be disconnected with the word lines of various rows of the said second flash array, and causes the first reference word line of the said first row of reference cells to be disconnected with the second reference word line of the said second row of reference cells.

The said first row of reference cells after programming enables various bit lines of the said first flash array to form a first reference current, and the said second row of reference cells after programming enables various bit lines of the said second flash array to form a second reference current; the said first reference current is to be used as a reference current while performing read operation on the said second flash array, the said second reference current is to be used as a reference current while performing read operation on the said first flash array.

One further improvement is that the number of columns for the said first flash array is the same as that for the said second flash array.

One further improvement is that under the programming operation mode of the said flash, the said word-line switching circuit enables the word lines of various rows of the said first flash array to be connected with the word lines of the corresponding rows of the said second flash array.

One further improvement is that under the programming operation mode of the said flash, the said word-line switching circuit enables the first reference word line of the said first row of reference cells to be connected with the second reference word line of the said second row of reference cells.

One further improvement is that under the erasure operation mode of the said flash, the said word-line switching circuit enables the word lines of various rows of the said first flash array to be connected with the word lines of the corresponding rows of the said second flash array.

One further improvement is that under the erasure operation mode of the said flash, the said word-line switching circuit enables the first reference word line of the said first row of reference cells to be connected with the second reference word line of the said second row of reference cells.

One further improvement is that the said first reference current is in proportion to the average current for the memory cells of the said flash; that the said second reference current is in proportion to the average current for the memory cells of the said flash.

One further improvement is that the said first reference current equals to 15%, 30% or 55% of the average current for the memory cells of the said flash; that the said second reference current equals to 15%, 30% or 55% of the average current for the memory cells of the said flash.

One further improvement is that the said reference cell has the same structure as the said memory cell.

One further improvement is that the said memory cell is floating-gate transistors.

One further improvement is that the said flash is NAND flash or NOR flash.

In order to resolve the above-mentioned technical problem, the reference-current generation method for flash provided by this invention covers the following steps:

To program for the reference current:
to program for the first row of reference cells so that the said first row of reference cells after programming enables various bit lines of the said first flash array to form a first reference current; to program for the second row of reference cells so that the said second row of reference cells after programming enables various bit lines of the said second flash array to form a second reference current.

To perform read operation for the said flash:
to switch the said word-line switching circuit, so that the word lines of various rows of the said first flash array is disconnected with the word lines of various rows of the said second flash array, and the first reference word line of the said first row of reference cells is disconnected with the second reference word line of the said second row of reference cells.

To perform read operation for the memory cells of the said first flash array, with the second reference current as shown taken as the read reference current.

To perform read operation for the memory cells of the said second flash array, with the first reference current as shown taken as the read reference current.

One further improvement is that the said first reference current is in proportion to the average current for the memory cells of the said flash; that the said second reference current is in proportion to the average current for the memory cells of the said flash.

One further improvement is that the said first reference current equals to 15%, 30% or 55% of the average current for the memory cells of the said flash; that the said second reference current equals to 15%, 30% or 55% of the average current for the memory cells of the said flash.

The current for the reference-current generation circuit according to prior art is provided by the reference cell of various columns, while in this invention, the reference units are arranged in the direction of raws, other than in the direction of columns; at the same time, the flash array of cells is divided into at least two flash arrays, namely the first memory cell and the second memory cell, which are separated by a word-line switching circuit. Each reference cell is arranged at the corresponding column of memory cells, so that by programming various reference cells, the currents for various bit lines of flash arrays can be used to provide reference currents. While performing read operation for memory cells, the word-line switching circuit separates the first memory array from the second memory array, so that when reading one of the flash arrays, the present invention may provide reference current by taking advantage of the bit lines of another or the other flash array. Since the reference current in this invention is also finally provided by the current for the bit lines of flash arrays, the reference current will change accordingly when the flash array varies with performance, work process, voltage and temperature. Therefore, this invention can enhance the velocity and precision of the sensitive amplifier as well as the yield and performance of the flash as a whole.

BRIEF DESCRIPTION OF THE DRAWINGS

Further detailed descriptions of this invention in connection with attached drawings and are given as follows.

DETAILED DESCRIPTION

Figure 1:
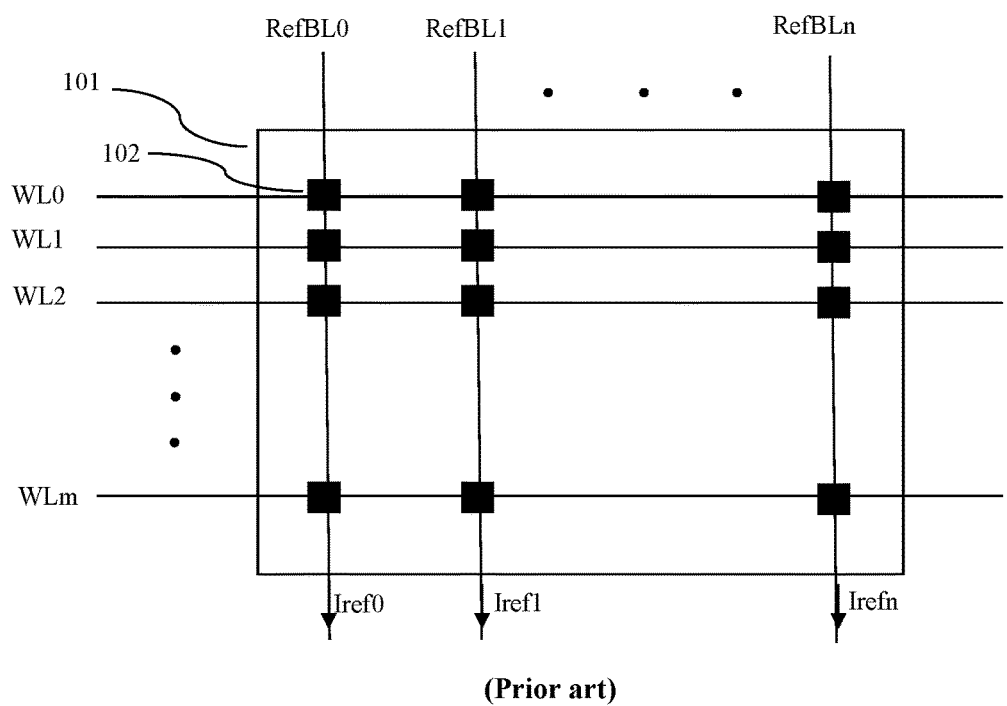
FIG. 1 is a circuit diagram of reference-current generation for existing flashes.
Figure 2:
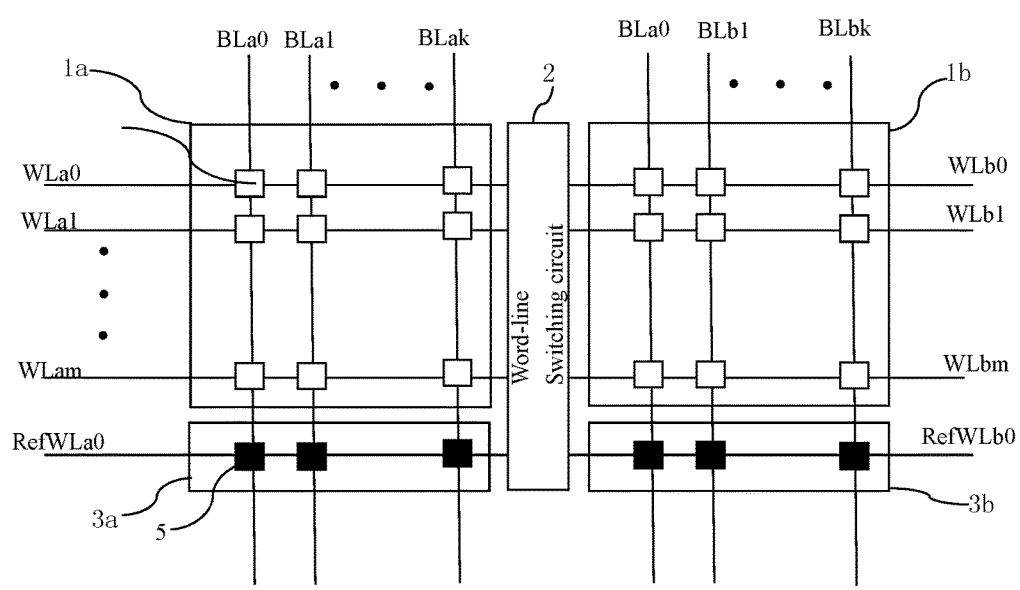
FIG. 2 is a circuit diagram of reference-current generation for the flash of the preferred embodiment.

FIG. 2 is a circuit diagram of reference-current generation for the flash of the preferred embodiment. In the embodiment of this invention, the flash comprises at least two flash arrays consisting of memory cells 4 (arranged into rows and columns) only and having the same number of rows thereof, namely the first memory array 1a and the second memory array 1b; a preferred embodiment is that the number of columns (memory cells) for the first memory array 1a is the same as that for the second memory array 1b.

In FIG. 2, both the first memory array 1a and the second memory array 1b share the same number of row m, as well as the same number of columns k.

All the memory cells 4 of the same row in the said first flash array 1a are linked with the same word line. The word lines are represented by WLa0, WLa1 until WLam, respectively, of which the number that appears at the end represents the respective number of rows, "WL" stands for a word line and "a" corresponds with the said first flash array 1a. All the memory cells 4 of the same row in the said second flash array 1b are linked with the same word line with the word lines represented by WLb0, WLb1 until WLbm, respectively, of which the number that appears at the end represents the respective number of rows, "WL" stands for a word line and "b" corresponds with the said second flash array 1b.

All the memory cells 4 of the same column in the said first flash array 1a are linked with the same bit line. The bit lines represented by BLa0, BLa1 until BLak, respectively, of which the number that appears at the end represents the respective number of columns, "BL" stands for a bit line and "a" corresponds with the said first flash array 1a. All the memory cells 4 of the same column in the said second flash array 1b are linked with the same bit line with the bit lines represented by BLa0, BLa1 until BLak, respectively, of which the number that appears at the end represents the respective number of columns, "BL" stands for a bit line and "b" corresponds with the said second flash array 1b.

The word-line switching circuit 2 is arranged between the said first flash array 1a and the said second flash array 1b.

Under the read operation mode of the said flash, the said word-line switching circuit 2 enables the word lines of various rows of the said first flash array 1a to be disconnected with the word lines of various rows of the said second flash array 1b. An improved embodiment is that under the other operation modes of the said flash, such as Erasure or Program, the said word-line switching circuit 2 enables the word lines of various rows of the said first flash array 1a to be connected with the word lines of various rows of the said second flash array 1b.

The reference-current generation circuit comprises the first row of reference cells 3a and the second row of reference cells 3b. The said first row of reference cells 3a is parallel with the other rows of the first memory array 1a and has the same number of columns as the other rows thereof; the said second row of reference cells 3b is parallel with the other rows of the second memory array 1b and has the same number of columns as the other rows thereof. In FIG. 2, the first row of reference cells 3a is arranged at the bottom of the first memory array 1a; the second row of reference cells 3b is arranged at the bottom of the second memory array 1b.

Both the first row of reference cells 3a and the second row of reference cells 3b are arranged by reference cells 5 each of which is connected with the bit line of the respective column of the flash array. The said word-line switching circuit 2 is further extended between the said first row of reference cells 3a and the said second row of reference cells 3b. Under the read operation mode of the said flash, the said word-line switching circuit 2 enables the first reference word line RefWLa0 of the first row of reference cells 3a to be disconnected with the second reference word line RefWLb0 of the second row of reference cells 3b. In a preferred embodiment, under the other operation modes of the said flash, such as Erasure or Program, the said word-line switching circuit 2 enables the first reference word line RefWLa0 of the first row of reference cells 3a to be connected with the second reference word line RefWLb0 of the second row of reference cells 3b.

In an embodiment of this invention, all the said reference cells 5 can be programmed to form respective reference currents. The said first row of reference cells 3a after programming enables various bit lines of the said first flash array 1a to form a first reference current, and the said second row of reference cells 3b after programming enables various bit lines of the said second flash array 1b to form a second reference current; the said first reference current is to be used as the reference current while performing read operation for the said second flash array 1b, the said second reference current is to be used as the reference current while performing read operation for the said first flash array 1a.

In a preferred embodiment, the said first reference current is in proportion to the average current for the memory cells 4 of the said flash; the said second reference current is in proportion to the average current for the memory cells 4 of the said flash. One further improvement is that the said first reference current equals to 15%, 30% or 55% of the average current for the memory cells 4 of the said flash; the said second reference current equals to 15%, 30% or 55% of the average current for the memory cells 4 of the said flash. The above-mentioned proportional coefficients, i.e., 15%, 30% or 55%, are selected based on practical applications. While performing the read operation for the memory cell 4 of the said flash after setting the reference current, the status of the read memory cell 4 can be judged by comparing the read line current of the memory cell 4 with the reference current.

The reference cell 5 and the memory cell 4 have the same structure and are both floating-gate transistors. The said flash is NAND flashes or NOR flashes.

As shown in FIG. 2, while reading memory cells of the first flash array 1a, the reference current is to be extracted from the second flash array 1b, that is to say, to extract the second reference current; at this time, the first flash array 1a is separated from the second flash array 1b by means of the word-line switching circuit 2. Conversely, while reading memory cells of the second flash array 1b, the reference current is to be extracted from the first flash array 1a, that is to say, to extract the first reference current; at this time, the first flash array 1a is separated from the second flash array 1b by means of the word-line switching circuit 2.

In addition, the values of the first reference current and the second reference current can be independently and freely adjusted by programming for the existing reference voltage 5.

The reference-current generation method for flash provided by preferred embodiment of this invention covers the following steps:

to program for the reference current:

to program for the first row of reference cells 3a, so that after programming, the first row of reference cells 3a enables various bit lines of the first flash array 1a to create the first reference current; to program for the second row of reference cells 3b so that the second row of reference cells 3b after programming enables various bit lines of the second flash array 1b to create the second reference current. In a preferred embodiment, the first reference current is in proportion to the average current for the memory cells 4 of the flash; that the second reference current is in proportion to the average current for the memory cells 4 of the flash. In a further preferred embodiment, the first reference current equals to 15%, 30% or 55% of the average current for the memory cells 4 of the flash; that the second reference current equals to 15%, 30% or 55% of the average current for the memory cells 4 of the flash.

In the preferred embodiment of this invention, the reference current may be obtained by programming for reference cells during testing stages. In other words, various currents can be created by programming for reference cells, and can be compared with the average current of the memory cell of the main flash array before obtaining the reference current.

To perform the read operation for the said flash:

To perform the switching operation for the word-line switching circuit 2, so that the word lines of various rows of the first flash array 1a are disconnected with the word lines of various rows of the second flash array 1b, and the first reference word line RefWLa0 of the first row of reference cells 3a is disconnected with the second reference word line RefWLb0 of the second row of reference cells 3b.

To perform read operation for the memory cells 4 of the first flash array 1a, with the second reference current as shown taken as the read reference current.

To perform read operation for the memory cells 4 of the second flash array 1b, with the first reference current as shown taken as the read reference current.

The preferred embodiments of this invention are described above in detail. However, it does not intend to limit the scope of the present invention. Based on the principle of this invention, a person with ordinary skills in this art may make various modifications and improvement which shall be deemed within the scope of the invention.

What is claimed is:

1. A reference-current generation circuit for flash, wherein the flash comprises at least two flash arrays, namely, a first memory array and a second memory array, consisting of memory cells arranged into rows and columns and having the same number of rows thereof;
   the reference-current generation circuit comprising a first row of reference cells and a second row of reference cells, and the first row of reference cells and the second row of reference cells are arranged by reference cells, with the first row of reference cells parallel with the other rows of the first memory array and having the same number of columns as the other rows thereof, and with a second row of reference cells parallel with the other rows of the second memory array and having the same number of columns as the other rows thereof;
   a word-line switching circuit is arranged between the first memory array and the second memory array and is extended between the first row of reference cells and the second row of reference cells, and under a Read operation mode of the flash, the word-line switching circuit causes the word lines of various rows of the first memory array to be disconnected with the word lines of various rows of the second memory array, and causes a first reference word line of the first row of reference cells to be disconnected with a second reference word line of the second row of reference cells;
   the first row of reference cells after programming enables various bit lines of the first memory array to form a first reference current, and the second row of reference cells after programming enables various bit lines of the second memory array to form a second reference current; and
   the first reference current is to be used as the reference current while performing a Read operation for the second memory array, and the second reference current is to be used as the reference current while performing a Read operation for the first memory array.

2. The reference-current generation circuit for the flash of claim 1, wherein the first memory array has a same number of columns with the second memory array.

3. The reference-current generation circuit for the flash of claim 1, wherein under a Program operation mode of the flash, the word-line switching circuit causes word lines of various rows of the first memory array to be connected with the word lines of various rows of the second memory array.

4. The reference-current generation circuit for the flash of claim 1, wherein under a Program operation mode of the flash, the word-line switching circuit causes the first reference word line of the first row of reference cells to be connected with the second reference word line of the second row of reference cells.

5. The reference-current generation circuit for the flash of claim 1, wherein under an Erase operation mode of the flash, the word-line switching circuit causes the word lines of various rows of the first memory array to be connected with the word lines of various rows of the second memory array.

6. The reference-current generation circuit for the flash of claim 1, wherein under an Erase operation mode of the flash, the word-line switching circuit causes the first reference word line of the first row of reference cells to be connected with the second reference word line of the second row of reference cells.

7. The reference-current generation circuit for the flash of claim 1, wherein the first reference current is in proportion to an average current for the memory cells of the flash and that the second reference current is in proportion to the average current for the memory cells of the flash.

8. The reference-current generation circuit for the flash of claim 7, wherein the first reference current equals to 15%, 30% or 55% of the average current for the memory cells of the flash; that the second reference current equals to 15%, 30% or 55% of the average current for the memory cells of the flash.

9. The reference-current generation circuit for the flash of claim 1, wherein the reference cells have the same structure as the memory cells.

10. The reference-current generation circuit for the flash of claim 9, wherein the memory cells are floating-gate transistors.

11. The reference-current generation circuit for the flash of claim 1, wherein the flash is a NAND flash or a NOR flash.

12. A method for generating a reference circuit by using the reference-current generation circuit for the flash of claim 1, comprising the following steps:
   program the reference current by programming the first row of reference cells so that the first row of reference cells after programming enables various bit lines of the first memory array to form a first reference current; to program for the second row of reference cells so that the second row of reference cells after programming enables various bit lines of the second memory array to form a second reference current;
   perform a Read operation for the flash by switching the word-line switching circuit, so that the word lines of various rows of the first memory array are disconnected with the word lines of various rows of the second memory array and the first reference word line of the first row of reference cells is disconnected with the second reference word line of the second row of reference cells;

perform a Read operation for the memory cells of the first memory array, with the second reference current as shown taken as a read reference current; and perform a Read operation for the memory cells of the second memory array, with the first reference current as shown taken as the read reference current.

13. The reference-current generation circuit for the flash of claim 12, wherein the first reference current is in proportion to the average current for the memory cells of the flash and that the second reference current is in proportion to an average current for the memory cells of the flash.

14. The reference-current generation circuit for the flash of claim 13, wherein the first reference current equals to 15%, 30% or 55% of the average current for the memory cells of the flash; that the second reference current equals to 15%, 30% or 55% of the average current for the memory cells of the flash.

\* \* \* \* \*